United States Patent
Gu et al.

(10) Patent No.: US 11,191,144 B2
(45) Date of Patent: Nov. 30, 2021

(54) LIGHT SUPPLEMENT MODULE, LIGHT SUPPLEMENT CONTROL METHOD AND TERMINAL FOR LIGHT SUPPLEMENT MODULE

(71) Applicant: Beijing Xiaomi Mobile Software Co., Ltd., Beijing (CN)

(72) Inventors: Jianglin Gu, Beijing (CN); Jian Bai, Beijing (CN); Lin Chen, Beijing (CN); Shujun Wei, Beijing (CN); Chiafu Yen, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/697,698

(22) Filed: Nov. 27, 2019

(65) Prior Publication Data

US 2020/0375005 A1    Nov. 26, 2020

(30) Foreign Application Priority Data

May 21, 2019  (CN) .......................... 201910426099.4

(51) Int. Cl.
*H05B 47/11*  (2020.01)
*F21K 9/66*  (2016.01)
(Continued)

(52) U.S. Cl.
CPC ................ *H05B 47/11* (2020.01); *F21K 9/62* (2016.08); *F21K 9/66* (2016.08); *G03B 15/03* (2013.01);
(Continued)

(58) Field of Classification Search
CPC ............ H05B 33/0815; H05B 33/0818; H05B 41/2828; H05B 41/3921; H05B 41/3927;
(Continued)

(56) References Cited

U.S. PATENT DOCUMENTS

2005/0265029 A1*  12/2005  Epstein ................. G09F 9/3026
                                                                    362/339
2007/0030675 A1    2/2007  Oon et al.
(Continued)

FOREIGN PATENT DOCUMENTS

CN      104181752 A    12/2014
CN      205316165 U     6/2016
(Continued)

OTHER PUBLICATIONS

Extended European Search Report dated Sep. 4, 2020 in European Patent Application No. 19213841.0, 16 pages.
(Continued)

*Primary Examiner* — Minh D A
(74) *Attorney, Agent, or Firm* — Oblon, McClelland, Maier & Neustadt, L.L.P.

(57) ABSTRACT

The disclosure relates to a light supplement device or module, and a light supplement control method, a terminal, and an apparatus for the light supplement module, and belongs to the technical field of electronic devices. The light supplement module includes a circuit substrate; n Light Emitting Diodes (LED) disposed in an array on the circuit substrate, n being an integer greater than 1, and there being at least two LEDs having different colors; and a light guiding layer disposed on an upper layer of the n LEDs, wherein the LEDs are color LEDs, or the n LEDs constitute a color LED group.

10 Claims, 5 Drawing Sheets

(51) Int. Cl.
*F21K 9/62* (2016.01)
*H05B 45/14* (2020.01)
*H05B 45/325* (2020.01)
*H05B 45/10* (2020.01)
*G03B 15/03* (2021.01)
*F21Y 113/17* (2016.01)
*F21Y 115/10* (2016.01)

(52) U.S. Cl.
CPC ............. *H05B 45/10* (2020.01); *H05B 45/14* (2020.01); *H05B 45/325* (2020.01); *F21Y 2113/17* (2016.08); *F21Y 2115/10* (2016.08)

(58) Field of Classification Search
CPC ............. H05B 41/2855; H05B 41/386; H05B 41/2882; H05B 37/029; H05B 33/0803; H05B 37/0254; H05B 37/02; H05B 41/36; H05B 41/00; Y02B 20/204; Y02B 20/202; H01J 61/52; H01J 65/044; H01J 61/523; H01J 13/32; H01J 7/24; H01J 19/36; H01J 2893/0027; H01J 19/80; H01J 25/18; H01J 25/04; H01J 21/10; H01J 23/38; F21K 9/00; F21V 29/004; F21V 25/10; F21V 25/04
See application file for complete search history.

(56) References Cited

U.S. PATENT DOCUMENTS

| | | | |
|---|---|---|---|
| 2007/0257992 A1 | 11/2007 | Kato | |
| 2012/0019743 A1* | 1/2012 | Chen | G02B 6/0065 349/65 |
| 2014/0104253 A1* | 4/2014 | Koyanagi | G09G 3/2003 345/207 |
| 2014/0340573 A1* | 11/2014 | Clawson | H04M 1/185 348/371 |
| 2015/0109455 A1* | 4/2015 | Pang | H04N 5/33 348/164 |
| 2016/0088278 A1* | 3/2016 | Velarde | H04N 5/2354 348/371 |
| 2016/0313491 A1* | 10/2016 | Li | G09G 3/2003 |
| 2018/0089409 A1* | 3/2018 | Zhang | G09G 3/2003 |
| 2019/0037125 A1* | 1/2019 | Jiang | H04N 9/735 |
| 2019/0082511 A1* | 3/2019 | Bong | H05B 45/20 |
| 2019/0086729 A1* | 3/2019 | Saito | G02B 6/0051 |

FOREIGN PATENT DOCUMENTS

| | | |
|---|---|---|
| CN | 106101569 A | 11/2016 |
| CN | 107580384 A | 1/2018 |
| EP | 2 512 122 A1 | 10/2012 |
| JP | 2004-233714 A | 8/2004 |
| TW | 201307979 A1 | 2/2013 |
| TW | M577510 U | 5/2019 |

OTHER PUBLICATIONS

Partial European Search Report dated Jun. 4, 2020 in corresponding European Patent Application No. 19213841.0, 15 pages.
Office Action issued in corresponding Chinese Patent Application No. 201910426099.4 dated May 27, 2021 (with English translation) 26 pages.

\* cited by examiner

Fig. 11

LIGHT SUPPLEMENT MODULE, LIGHT SUPPLEMENT CONTROL METHOD AND TERMINAL FOR LIGHT SUPPLEMENT MODULE

CROSS-REFERENCE TO RELATED APPLICATIONS

This application is based upon and claims priority to Chinese Patent Application No. 201910426099.4, filed May 21, 2019, the entire contents of all of which are incorporated herein by reference.

TECHNICAL FIELD

The present disclosure relates to the technical field of electronic devices and, more particularly, to a light supplement module, a light supplement control method, a terminal, and an apparatus for the light supplement module.

BACKGROUND

When a terminal (such as a mobile phone, a tablet, etc.) with a photo or video function is shooting, a camera needs a sufficient amount of light to ensure the sharpness of the captured image.

In order to increase the amount of light entering the camera, the terminal usually provides a light supplement lamp for the camera. When the light supplement lamp is turned on, light reflected from scenery into the camera increases, ensuring the sharpness of photographing of the camera.

SUMMARY

This Summary is provided to introduce a selection of aspects of the present disclosure in a simplified form that are further described below in the Detailed Description. This Summary is not intended to identify key features or essential features of the claimed subject matter, nor is it intended to be used to limit the scope of the claimed subject matter.

Aspects of the disclosure provide a light supplement device that includes a circuit substrate; n Light Emitting Diodes (LED) disposed in an array on the circuit substrate, n being an integer greater than 1, and there being at least two LEDs having different colors; and a light guiding layer disposed on an upper layer of the n LEDs, wherein the LEDs are color LEDs, or the n LEDs constitute a color LED group.

According to an aspect, the circuit substrate is electrically connected to a color temperature control chip, and the color temperature control chip is configured to adjust single or overall brightness and/or color temperature of the n LEDs.

According to another aspect, the circuit substrate is electrically connected to a color temperature control chip, the color temperature control chip is electrically connected to a processor, and the processor is electrically connected to a color temperature sensor, wherein the color temperature sensor is configured to collect data of ambient color temperature, wherein the processor is configured to obtain the data of ambient color temperature, calculate a value of ambient color temperature according to the data of ambient color temperature, and send the value of ambient color temperature to the color temperature control chip, and wherein the color temperature control chip is configured to adjust an overall color temperature of the n LEDs according to the value of ambient color temperature.

In an example, the circuit substrate is electrically connected to a color temperature control chip, and the color temperature control chip is electrically connected to a processor, wherein the processor is configured to perform color temperature analysis on a shot preview image to obtain a value of ambient color temperature, and wherein the color temperature control chip is configured to adjust an overall color temperature of the n LEDs according to the value of ambient color temperature.

In another example, the color temperature control chip is configured to adjust the overall color temperature of the n LEDs using a negative feedback mechanism according to the value of ambient color temperature and a reference value of color temperature.

In yet another example, the n LEDs disposed in the array include: a red LED, a green LED and a blue LED.

In yet another example, a red sub-LED, a green sub-LED and a blue sub-LED are packaged in at least one of the n LEDs disposed in the array.

According to an aspect, each of the LEDs is disposed in parallel with each other, and the color temperature control chip is configured to control brightness of each LED and a color ratio of an overall LED module.

According to another aspect, the light supplement device further includes a light homogenizing layer, wherein the light homogenizing layer is disposed between the light guiding layer and the n LEDs, or the light homogenizing layer is disposed on an upper layer of the light guiding layer.

In an example, the light homogenizing layer includes at least one of a diffusion layer or a light homogenizing lens.

In another example, an interval of an overall color temperature of the n LEDs includes: 2000 Kelvin to 7500 Kelvin.

Aspects of the disclosure also provide a light supplement control method for a light supplement device, wherein the light supplement device includes a circuit substrate; n Light Emitting Diodes (LED) disposed in an array on the circuit substrate, n being an integer greater than 1, and there being at least two LEDs having different colors; a light guiding layer disposed on an upper layer of the n LEDs, wherein the LEDs are color LEDs, or the n LEDs constitute a color LED group. The method includes obtaining an ambient parameter of current shooting ambient; and adjusting overall brightness and/or overall color temperature of the n LEDs according to the ambient parameter.

According to an aspect, when obtaining the ambient parameter of the current shooting ambient the method further includes collecting data of ambient color temperature; and calculating a value of ambient color temperature according to the data of ambient color temperature for adjusting the overall color temperature of the n LEDs according to the value of ambient color temperature.

According to another aspect, when obtaining the ambient parameter of the current shooting ambient, the method further includes performing color temperature analysis on a shot preview image to obtain a value of ambient color temperature for adjusting the overall color temperature of the n LEDs according to the value of ambient color temperature and an expected shooting effect.

According to yet another aspect, when adjusting the overall color temperature of the n LEDs, the method includes adjusting the overall color temperature of the n LEDs using a negative feedback mechanism according to the value of ambient color temperature and a reference value of color temperature.

In an example, when adjusting the overall color temperature of the n LEDs using the negative feedback mechanism according to the value of ambient color temperature and the reference value of color temperature, the method further includes determining the reference value of color temperature according to a white balance requirement; determining, according to a difference between the value of ambient color temperature and the reference value of color temperature, a target group PWM signal from at least two sets of control parameters according to the negative feedback mechanism, each set of the control parameters comprising n PWM signals used for controlling the overall color temperature of the n LEDs to be a target color temperature, the n PWM signals corresponding to the n LEDs; and using the n PWM signals in the target group PWM signal to control the n LEDs respectively, wherein the n PWM signals comprise a current signal and/or a voltage signal.

Aspects of the disclosure also provide a terminal including a middle frame; a front side and a back side of the middle frame; a camera disposed on the front side and/or the back side of the middle frame; a light supplement device disposed on the front side and/or the back side of the middle frame, wherein the light supplement device includes: a circuit substrate; n Light Emitting Diodes (LED) disposed in an array on the circuit substrate, n being an integer greater than 1, and there being at least two LEDs having different colors; and a light guiding layer being disposed on an upper layer of the n LEDs, wherein the LEDs are color LEDs, or the n LEDs constitute a color LED group and wherein a range enclosed by the middle frame includes: a processor; a transceiver coupled to the processor; and a memory for storing instructions executable by the processor. The processor is configured to obtain an ambient parameter of current shooting ambient; and adjust overall brightness and/or overall color temperature of the n LEDs according to the ambient parameter.

According to an aspect, the processor is further configured to collect data of ambient color temperature; and calculate a value of ambient color temperature according to the data of ambient color temperature for adjusting the overall color temperature of the n LEDs.

According to another aspect, the processor is further configured to perform color temperature analysis on a shot preview image to obtain a value of ambient color temperature for adjusting the overall color temperature of the n LEDs.

According to yet another aspect, the processor is further configured to adjust the overall color temperature of the n LEDs using a negative feedback mechanism according to the value of ambient color temperature and a reference value of color temperature.

According to yet another aspect, the processor is further configured to determine the reference value of color temperature according to a white balance requirement; determine, according to a difference between the value of ambient color temperature and the reference value of color temperature, a target group PWM signal from at least two sets of control parameters according to the negative feedback mechanism; each set of the control parameters comprising n PWM signals used for controlling the overall color temperature of the n LEDs to be a target color temperature, the n PWM signals corresponding to the n LEDs; and use the n PWM signals in the target group PWM signal to control the n LEDs respectively, wherein the n PWM signals comprise a current signal and/or a voltage signal.

In an example, the light supplement device is a strip structure, and the light supplement device is disposed in a non-display area near the camera between a display area of the terminal and the middle frame.

In another example, the light supplement device is disposed inside a terminal corresponding to a non-display area between a display area of the terminal and the middle frame, and wherein the non-display area is disposed with a through hole for transmitting light of the light supplement device.

It is to be understood that both the foregoing general description and the following detailed description are illustrative and explanatory only and are not restrictive of the present disclosure.

BRIEF DESCRIPTION OF THE DRAWINGS

The accompanying drawings, which are incorporated in and constitute a part of this specification, illustrate aspects consistent with the present disclosure, and together with the description, serve to explain the principles of the present disclosure.

The specific aspects of the present disclosure, which have been illustrated by the accompanying drawings described above, will be described in detail below. These accompanying drawings and description are not intended to limit the scope of the present disclosure in any manner, but to explain the concept of the present disclosure to those skilled in the art via referencing specific aspects.

DETAILED DESCRIPTION

Reference will now be made in detail to exemplary aspects, examples of which are illustrated in the accompanying drawings. The following description refers to the accompanying drawings in which the same numbers in different drawings represent the same or similar elements unless otherwise represented. The implementations set forth in the following description of illustrative aspects do not represent all implementations consistent with the disclosure. Instead, they are merely examples of apparatuses and methods consistent with aspects related to the disclosure as recited in the appended claims.

Figure 1:
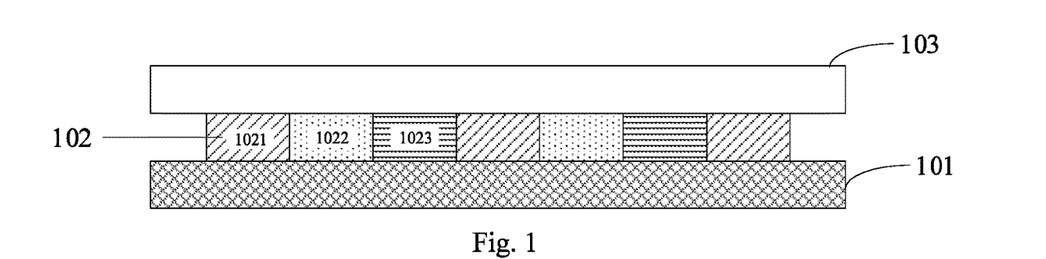
FIG. 1 is a side cross-sectional view illustrating a light supplement module according to an exemplary aspect of the present disclosure.

The present aspect provides a light supplement module. FIG. 1 is a side cross-sectional view illustrating a light supplement module according to an exemplary aspect of the present disclosure. The light supplement module may be a light supplement device and may include a circuit substrate 101 and an LED array 102 disposed on the circuit substrate 101. The LED array 102 includes a plurality of Light Emitting Diodes (LEDs), and a light guiding layer is disposed outside the LED.

The circuit substrate 101 may be a Printed Circuit Board (PCB) or a Flexible Printed Circuit Board (FPCB). A plurality of contacts are disposed on the circuit substrate 101, and each contact corresponds to one LED.

Colors of at least two LEDs in the LED array 102 are different. Light rays emitted from the LEDs of different color temperatures are mixed to obtain a new light ray with a different color temperature range. The light supplement module uses the mixed light ray to supplement a camera.

An upper layer of the n LEDs is provided with a light guiding layer 103 for mixing light of different colors. When each LED is colorful, the light guiding layer 103 is disposed on an outer layer of each LED, or one light guiding layer 103 is disposed outside the plurality of LEDs, and the plurality of LEDs share one light guiding layer 103. When the LED is a monochromatic LED, the light guiding layer 103 is disposed on the outer layer of the plurality of LEDs. For example, a red LED 1021, a green LED 1022 and a blue LED 1023 are regarded as a group, and one light guiding layer 103 is disposed on the outer layers of the three LEDs 102, or one light guiding layer 103 is disposed on the outer layer of all the LEDs, and all the LEDs share one light guiding layer 103, thereby achieving the purpose of mixing light of different colors. In the aspect, the number and luminous color of LEDs included in each light guiding layer 103 are not limited.

Optionally, n Light Emitting Diodes (LEDs) are disposed in an array on the circuit substrate, n being an integer greater than 2, and there are at least three LEDs having different colors.

In summary, the present aspect provides the plurality of LED lamps with different color temperature ranges (different colors) on the circuit substrate 101, by changing colors of the plurality of LED lamps, or changing a light-emitting ratio of the LEDs of different colors, the camera is provided with complementary light of different color temperatures to achieve the purpose of personalized light supplement.

A red sub-LED, a green sub-LED and a blue sub-LED are packaged in at least one of the n LEDs disposed in the array. For example, each LED may emit light of different colors. Exemplarily, each LED includes therein a luminous body capable of emitting red, green and blue light, and by changing a relative brightness ratio of each luminous body, or changing light and shade of the sub-LED of each color, light of different color temperatures may be obtained.

Optionally, each of the n LEDs disposed in the array is monochromatic. For example, the n LEDs disposed in the array include a red LED, a green LED and a blue LED. The n LEDs form a color LED group. Exemplarily, in the color LED group, each LED may emit only one color of light, and light of different color temperatures may be obtained by changing the relative brightness ratio of each LED. For example, the color LED group includes three colors, namely, a red LED 1021, a green LED 1022, and a blue LED 1023. To obtain warm light, luminance of the red LED 1021 may be increased, and luminance of the green LED 1022 and the blue LED 1023 may be lowered. It is also possible to increase the lighting number of the red LED 102 or to reduce the lighting number of the green LED 1022 or the blue LED 102.

The n LEDs disposed in the array may also include a color LED and a monochrome LED at the same time. The proportion of each type of LED is not limited in the present aspect.

In summary, in the present aspect, by adopting an LED capable of emitting at least 3 unit color lights, and adjusting the color temperature light of each LED, the color temperature light meeting the demand is obtained, and individual needs of users are satisfied.

Figure 2:
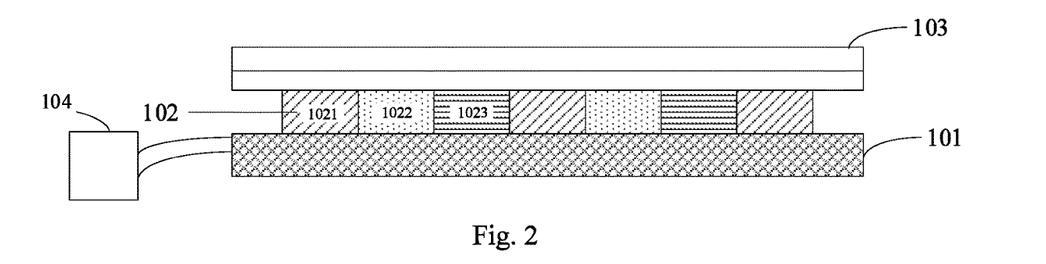
FIG. 2 is a front structural view illustrating a light supplement module according to another exemplary aspect of the present disclosure.

FIG. 2 is a lateral sectional view illustrating a light supplement module according to an exemplary aspect of the present disclosure. The circuit substrate 101 is electrically connected to the color temperature control chip 104, and the color temperature control chip 104 is used to control light emitting state of each LED. For example, by controlling the brightness of each LED, or controlling the color of each LED, and adjusting the proportion of light of LEDs having different colors, the purpose of adjusting the color temperature of the LED is achieved.

The light supplement module further includes a processor, and the processor is electrically connected to the color temperature control chip 104. A connection manner includes a Serial Peripheral Interface (SPI) or a serial interface, and the connection manner is not limited in this aspect. The processor is also electrically connected to a color temperature sensor, and the connection manner includes an SPI interface or an Inter-Integrated Circuit (IIC) interface. The connection manner is not limited in the aspect.

The color temperature sensor is used to collect data of ambient color temperature and send the data of ambient color temperature to the processor. After obtaining the data of ambient color temperature, the processor calculates a value of ambient color temperature according to the data of ambient color temperature, and sends the value of ambient color temperature to the color temperature control chip 104. The color temperature control chip 104 adjusts the overall color temperature of the plurality of LEDs according to the value of ambient color temperature. The value of ambient color temperature is calculated based on wavelength and frequency of light in ambient light. For example, a longer wavelength indicates a higher value of ambient color temperature.

Optionally, the processor may further perform color temperature analysis on a shot preview image to obtain the value of ambient color temperature.

The device or terminal displays a shot preview image on a display area (such as a display screen) before shooting, and the shot preview image is used to preview status of a shot sample before shooting, so that the user may adjust relevant shooting data in advance. Exemplarily, the processor divides the shot preview image to form a plurality of areas, and separately analyzes image data in each area to obtain the value of ambient color temperature.

Exemplarily, the processor divides the shot preview image to form a plurality of areas, and separately analyzes image data in each area to obtain the value of ambient color temperature.

Each of the LEDs disposed in the array is disposed in parallel with each other. That is, the lighting state of each LED may be individually controlled. When it is detected that the value of ambient color temperature is lower than an expected value (or a preset reference value of color temperature), the processor and the color temperature control chip 104 starts the light supplement module, controls the light emitting state of the LED in the light supplement module, increases the proportion of red light, or reduces the proportion of green light and blue light, and supplements light with high value of color temperature to the camera. When it is detected that the value of ambient color temperature is higher than the expected value (or the preset reference value of color temperature), the processor and the color temperature control chip 104 starts the light supplement module, controls the light emitting state of the LED in the light supplement module, reduces the proportion of red light, or increases the proportion of green light and blue light, and supplements light with low value of color temperature to the camera. Exemplarily, when the value of ambient color temperature and the preset reference value of color temperature have a difference, the color temperature control chip uses a negative feedback mechanism to adjust the overall color temperature of the plurality of LEDs, so that the complementary light emitted by the light supplement module may make the ambient light color temperature of the object being shot reach or close to the reference value of color temperature.

The present aspect sets the color temperature sensor or detects the value of ambient color temperature according to the shot preview image, the light supplement module is started when the value of color temperature is lower than (or higher than) the expected value or preset reference value of color temperature, and the color temperature state of the shot image is adjusted by controlling the light emitting state of the LEDs in the light supplement module. Since the color temperature in the image is the color temperature state of real ambient, it is possible to effectively avoid a distortion problem in related art due to changing the color temperature of the shot image by an algorithm.

The light supplement module further includes a light homogenizing layer disposed on an upper layer of the light guiding layer or between the light guiding layer and the n LEDs. Exemplarily, the light homogenizing layer includes at least one kind of a diffusion layer or a light homogenizing lens. A relative positional relationship between the light homogenizing lens, the LEDs and the light guiding layer is not limited. The diffusion layer is used to make the light emitted by the light supplement module more uniform and scattered, and softer, so that the shot image is more natural. The light homogenizing lens is used to make brightness of the light in the light transmitting area more uniform.

An interval of the overall color temperature of the n LEDs includes 2000 Kelvin to 7500 Kelvin. Due to the wide range of color temperature of the light supplement module, it may meet usage needs of most users and scenarios.

The present disclosure further provides a light supplement control method for the light supplement module. the light supplement module includes: a circuit substrate; n Light Emitting Diodes (LED) disposed in an array on the circuit substrate, n being an integer greater than 1, and there being at least two LEDs having different colors; and a light guiding layer is disposed on an upper layer of the n LEDs; wherein, the LEDs are color LEDs, or the n LEDs constitute a color LED group; the light supplement control method includes the following steps.

An ambient parameter of current shooting ambient is obtained.

The ambient parameter includes a wavelength and a frequency of the light in the ambient, and brightness and color temperature of the light in the ambient are calculated from the wavelength and frequency of the light.

Overall brightness and/or overall color temperature of the n LEDs disposed in the array on the circuit substrate are adjusted.

In summary, in the present aspect, a plurality of LEDs are arranged on the circuit substrate in the array, and the colors of the at least two LEDs are different. By adjusting the light emitting states of the LEDs of different color temperatures, the overall color temperature after mixing the light is obtained, thereby achieving the purpose of supplementing light with different color temperature for the camera.

Figure 3:
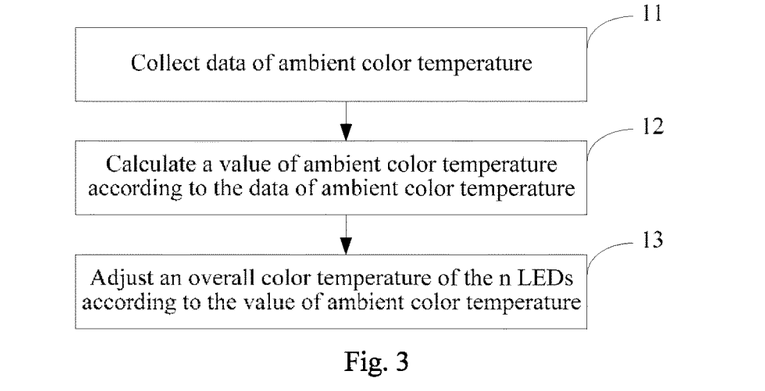
FIG. 3 is a flowchart illustrating a light supplement control method according to an exemplary aspect of the present disclosure.

FIG. 3 is a flowchart illustrating a light supplement control method according to an exemplary aspect of the present disclosure. The light supplement control method includes following steps.

In step 11, data of ambient color temperature is collected.

The color temperature sensor is used to collect the data of ambient color temperature. The data of ambient color temperature includes a wavelength, a frequency and a light intensity of the ambient light. The color temperature sensor sends the collected data of ambient color temperature to the processor for processing and calculation. The processor is a device or component with computing power. Exemplarily, the processor includes a Central Processing Unit (CPU) or an Internet Service Provider (ISP).

In step 12, a value of ambient color temperature is calculated according to the data of ambient color temperature.

After receiving the data of ambient color temperature, the processor calculates the value of ambient color temperature according to the data of ambient color temperature, and sends the value of ambient color temperature to the color temperature control chip.

In step 13, the overall color temperature of the n LEDs is adjusted according to the value of ambient color temperature.

After receiving the value of ambient color temperature sent by the processor, the color temperature control chip adjusts the overall color temperature of the plurality of LEDs according to the value of ambient color temperature.

In summary, the present aspect uses the color temperature sensor to collect the data of ambient color temperature, and uses the processor to calculate the value of ambient color temperature according to the data of ambient color temperature, and the color temperature control chip adjusts the overall color temperature of the LEDs in the light supplement module according to the value of ambient color temperature, thereby providing the light with appropriate color temperature for the camera.

Figure 4:
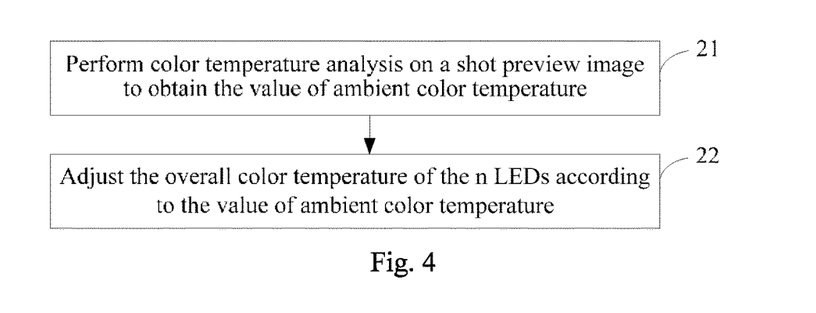
FIG. 4 is a flowchart illustrating a light supplement control method according to another exemplary aspect of the present disclosure.

FIG. 4 is a flowchart illustrating a light supplement control method according to another exemplary aspect of the present disclosure. The light supplement control method includes following steps.

In step 21, color temperature analysis is performed on a shot preview image to obtain the value of ambient color temperature.

The terminal displays the shot preview image before shooting scenery.

The processor may perform color temperature analysis according to the shot preview image to obtain the value of ambient color temperature. Exemplarily, the processor divides the shot preview image to form a plurality of areas, and separately analyzes image data in each area to obtain the value of ambient color temperature.

In step 22, the overall color temperature of the n LEDs is adjusted according to the value of ambient color temperature.

After receiving the value of ambient color temperature sent by the processor, the color temperature control chip adjusts the overall color temperature of the plurality of LEDs according to the value of ambient color temperature.

In summary, the method provided in this aspect obtains the value of ambient color temperature using the algorithm by analyzing the scenery in the shot preview image, and there is no need to set the color temperature sensor separately, thereby saving hardware cost and space of the terminal.

Figure 5:
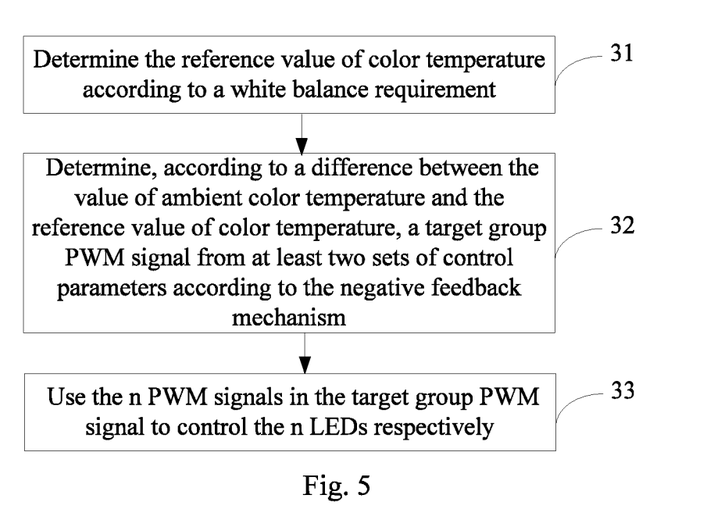
FIG. 5 is a flowchart illustrating a light supplement control method according to another exemplary aspect of the present disclosure.

In the above aspect, adjusting the overall color temperature of the n LEDs according to the value of ambient color temperature is achieved by adjusting the overall color temperature of the n LEDs according to the value of ambient color temperature and the reference color value of temperature using the negative feedback mechanism. The reference value of color temperature is determined according to the white balance requirement. FIG. 5 is a flowchart illustrating a method for adjusting the overall color temperature of the n LEDs according to another exemplary aspect of the present disclosure. In conjunction with FIG. 5, for the above step 103 or step 202, the method for adjusting the overall color temperature of the n LEDs includes the following steps.

In step 31, the reference value of color temperature is determined according to a white balance requirement.

In step 32, according to a difference between the value of ambient color temperature and the reference value of color temperature, a target group PWM signal is determined from at least two sets of control parameters according to the negative feedback mechanism.

Each set of the control parameters includes n PWM signals used for controlling the overall color temperature of the n LEDs to be a target color temperature, and the n PWM signals correspond to the n LEDs. In conjunction with Table 1:

a column of color temperature in Table 1 indicates the overall color temperature of the n LEDs in the light supplement module; R-CD indicates brightness of the red LED in the n LEDs in the light supplement module at the corresponding color temperature; G-CD indicates brightness of the green LED in the n LEDs in the light supplement module at the corresponding color temperature; and B-CD indicates brightness of the blue LED in the n LEDs in the light supplement module. R-PWM is a duty ratio of the red LED at the corresponding color temperature, G-PWM is a duty ratio of the green LED at the corresponding color temperature, and B-PWM is a duty ratio of the blue LED at the corresponding color temperature. The frequency is a flickering frequency of each LED. The duty ratio refers to a ratio of power-on time to total time in one pulse cycle, and the higher the ratio, the higher the brightness of the LED.

The control parameter is the duty ratio and proportional relationship of the LED of each color at the corresponding color temperature. It should be noted that Table 1 is only an exemplary relationship between the PWM signal and the color temperature of the LEDs with different colors, and is used to assist description of the aspects. The actual value of the color temperature is related to the LED, and needs to be measured according to actual conditions, thus the data in the table is not a qualification.

TABLE 1

| Color Temperature | R-CD | G-CD | B-CD | R-PWM | G-PWM | B-PWM | Frequency |
|---|---|---|---|---|---|---|---|
| 2000 | 300 mcd | 400 mcd | 580 mcd | 50% | 60% | 80% | 200 HZ |
| 2200 | 280 mcd | 410 mcd | 560 mcd | 45% | 65% | 75% | 200 HZ |
| 2500 | 270 mcd | 420 mcd | 540 mcd | 42% | 67% | 70% | 200 HZ |
| 3000 | 260 mcd | 430 mcd | 520 mcd | 40% | 70% | 65% | 200 HZ |
| 3500 | 250 mcd | 440 mcd | 500 mcd | 38% | 72% | 60% | 200 HZ |
| 4000 | 240 mcd | 450 mcd | 480 mcd | 35% | 75% | 55% | 200 HZ |
| 4500 | 220 mcd | 460 mcd | 460 mcd | 32% | 80% | 50% | 200 HZ |

In step 33, the n PWM signals in the target group PWM signal is used to control the n LEDs respectively.

Optionally, all of the n PWM signals are voltage signals, or all of them are current signals, or some of them are voltage signals, and some of them are current signals. Since each LED is independently set, it is possible to determine to use the voltage or current signal for control according to actual needs.

Taking the data in Table 1 as an example, the table corresponds to three colors of red (R), green (G), and blue (B) LEDs, so Table 1 includes three kinds of PWM signals. If the number of colors of the LED is other numbers, for example, there are 4 color LEDs, then 4 kinds of PWM signals are set.

After the target group PWM is determined, the n LEDs are respectively controlled according to the target group PWM signal, and the light emitting ratio or light intensity ratio of LED of each color is adjusted to obtain the overall color temperature.

Figure 6:
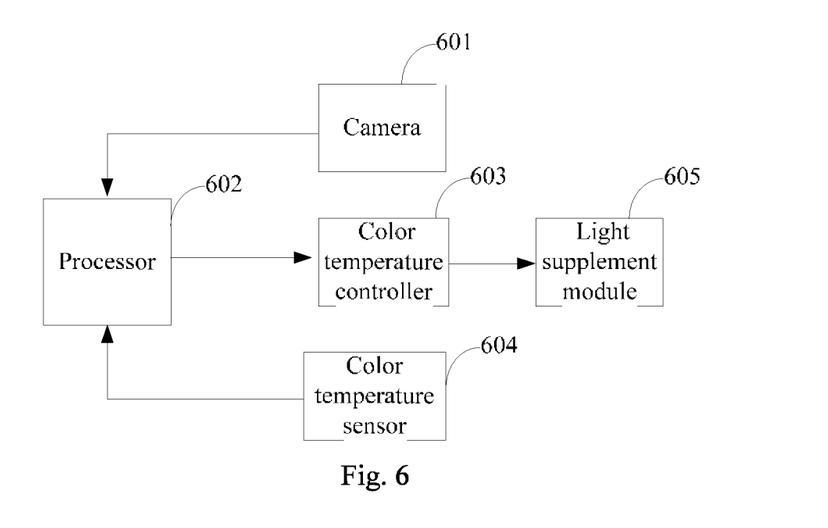
FIG. 6 is a schematic diagram illustrating connections of various partial structures of a terminal according to an exemplary aspect of the present disclosure.

The present aspect will be described below in conjunction with FIG. 6. FIG. 6 is a schematic diagram illustrating connection relationships of various parts of a terminal according to an exemplary aspect of the present disclosure. The terminal includes a camera 601, and a processor 602 connected to the camera 601, the camera 601 is also connected to the color temperature controller 603 and the color temperature sensor 604, and the color temperature controller 603 is connected to the light supplement module 605. The light supplement module 605 is a light supplement module provided in the foregoing aspects.

When the camera 601 is in operation, the color temperature sensor 604 collects the light in the ambient light to obtain the data of ambient color temperature, the color temperature sensor 604 sends the collected data of ambient color temperature to the processor 602, and the processor 602 calculates the value of ambient color temperature according to the data of ambient color temperature, and determines the target group PWM signal according to the value of ambient color temperature and the reference value of color temperature of the white balance requirement. Exemplarily, in conjunction with Table 1, when the value of ambient color temperature is 3000 Kelvin and the reference value of color temperature of the white balance requirement is 4000 Kelvin, the color temperature controller 603 determines the target group PWM signal from seven sets of control parameters by using the negative feedback mechanism, such as a group corresponding to the target group PWM signal of 4000 Kelvin.

The color temperature controller 603 controls the light supplement module 605 to jump to the PWM signal corresponding to 3500 Kelvin from the PWM signal corresponding to 3000 Kelvin, during the process, the color temperature sensor 604 and the processor 602 detect the value of ambient color temperature and compare it with the reference value of color temperature of 4000 Kelvin, and it is found that the value of ambient color temperature is still lower than the reference value of color temperature of 4000 Kelvin, then, the color temperature controller 603 controls the light supplement module 605 to jump from the PWM signal corresponding to the 3500 Kelvin to the PWM signal corresponding to the 4000 Kelvin. During the process, the color temperature sensor 604 and the processor 602 detect the value of ambient color temperature and compare it with the reference value of color temperature, and it is just equal to or close to the reference value of color temperature, then the negative feedback adjustment is completed. It should be noted that if the reference value of color temperature does not exactly correspond to a certain set of control parameters, then it is adjusted to use a set of PWM signals that are closest to the reference value of color temperature.

Since the higher the duty ratio, the higher the brightness, to adjust the brightness while keeping the color temperature constant, the duty ratio of LED of each color is simply increased or reduced at the same time, the adjusted ratio does not change, then the color temperature of the light supplement module is unchanged, and only the brightness changes. Therefore, based on the above idea, the scheme of adjusting the brightness by the light supplement module should also be within the protection scope of the present disclosure.

In summary, the color temperature adjustment method provided by the aspect adjusts the light emitting state of the light supplement module according to several sets of PWM signals by using the negative feedback mechanism, and finally achieves the purpose of supplementing light with different temperature colors for the camera. Due to the negative feedback mechanism, the shooting effect may be made closer to the reference value of color temperature, and the shooting effect is better.

Figure 7:
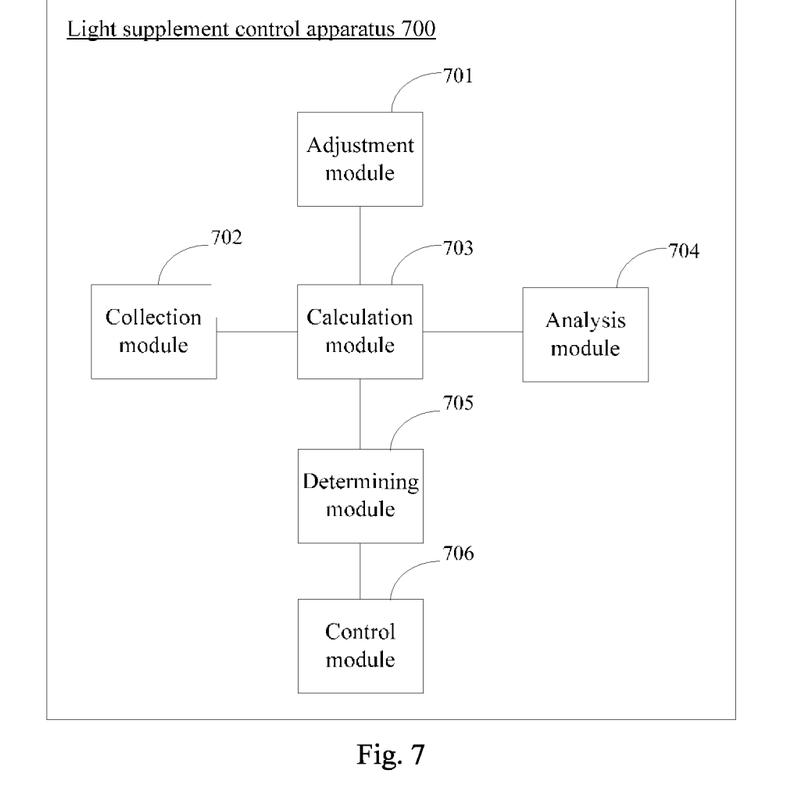
FIG. 7 is a block diagram illustrating a light supplement control apparatus according to another exemplary aspect of the present disclosure.

FIG. 7 is a block diagram illustrating a light supplement control apparatus 700 according to an exemplary aspect of the present disclosure. The light supplement module includes: a circuit substrate; and n Light Emitting Diodes (LED) disposed in an array on the circuit substrate, n being an integer greater than 1, and there being at least two LEDs having different colors; wherein, a light guiding layer is disposed on an upper layer of the n LEDs; and wherein, the LEDs are color LEDs, or the n LEDs constitute a color LED group; the apparatus includes: a collection module 702, configured to obtain an ambient parameter of current shooting ambient; and an adjustment module 701, configured to adjust overall brightness and/or overall color temperature of the n LEDs. The collection module 702 is configured to collect data of ambient color temperature; and the calculation module 703 is configured to calculate a value of ambient color temperature according to the data of ambient color temperature for adjusting the overall color temperature of the n LEDs according to the value of ambient color temperature.

The analysis module 704 is configured to perform color temperature analysis on a shot preview image to obtain a value of ambient color temperature for adjusting the overall color temperature of the n LEDs according to the value of ambient color temperature.

The adjustment module 701 is configured to adjust the overall color temperature of the n LEDs using a negative feedback mechanism according to the value of ambient color temperature and a reference value of color temperature.

The determining module 705 is configured to determine the reference value of color temperature according to a white balance requirement.

The determining module 705 is configured to determine, according to a difference between the value of ambient color temperature and the reference value of color temperature, a target group PWM signal from at least two sets of control parameters according to the negative feedback mechanism; each set of the control parameters includes n PWM signals used for controlling the overall color temperature of the n LEDs to be a target color temperature, the n PWM signals corresponds to the n LEDs; the control module 706 is configured to use the n PWM signals in the target group PWM signal to control the n LEDs respectively.

Figure 8:
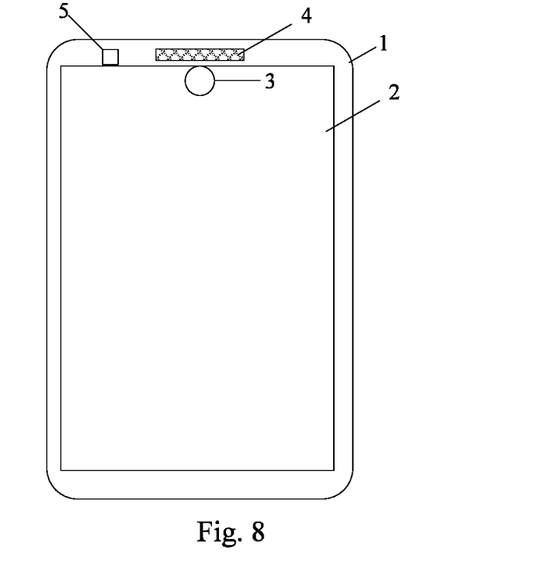
FIG. 8 is a front structural view illustrating a terminal according to an exemplary aspect of the present disclosure.
Figure 9:
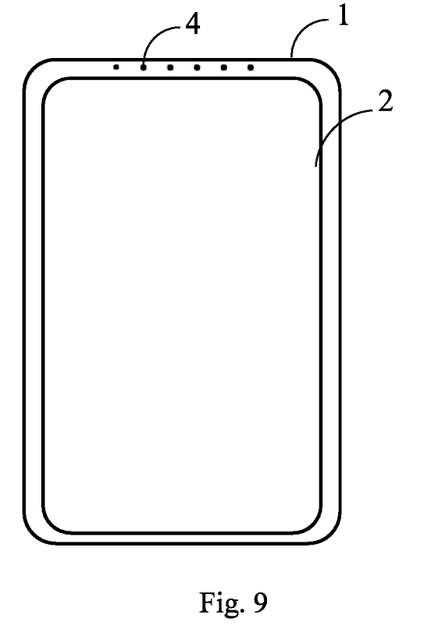
FIG. 9 is a front structural view illustrating a terminal according to another exemplary aspect of the present disclosure.
Figure 10:
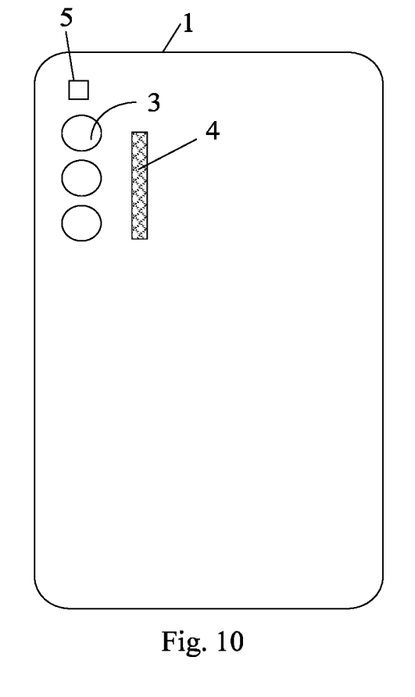
FIG. 10 is a rear structural diagram illustrating a terminal according to an exemplary aspect of the present disclosure.

The present disclosure also provides a terminal, in conjunction with FIG. 8, FIG. 9 and FIG. 10, FIG. 8 is a front structural view illustrating a terminal according to an exemplary aspect of the present disclosure, FIG. 9 is a front structural view illustrating a terminal according to another exemplary aspect of the present disclosure, FIG. 10 is a rear structural diagram illustrating a terminal according to an exemplary aspect of the present disclosure, the terminal includes a middle frame 1, a front side of the middle frame 1 includes a display area 2, and a non-display area is formed between the display area 2 and the middle frame. The front side of the middle frame is a front side of an area surrounded by the middle frame.

The display area is provided with a display screen module, the display screen module is a module for displaying interface content, and the display screen module may be an Organic Light Emitting Display (OLED) or a Liquid Crystal Display (LCD), or other module types used to display interface content. The front side of the middle frame 1 includes a camera 3, the camera 3 is disposed in the display area 2, and may also be disposed in the non-display area.

The front side of the middle frame 1 includes the light supplement module 4 for supplementing the camera 3 and a color temperature sensor 5 for detecting the value of ambient color temperature. Exemplarily, the light supplement module 4 is a strip structure disposed near a portion of the non-display area of the camera. The structure of the light supplement module 4 includes contents disclosed in the foregoing aspects, and details are not described herein again.

In conjunction with FIG. 9, in one aspect, the light supplement module 4 is disposed in a terminal corresponding to the non-display area of the terminal near the camera, a plurality of through holes are disposed in the non-display area of the terminal, and the through hole is used to pass the light emitted by the light supplement module 4, thereby achieving the purpose of supplementing the light for the camera.

In conjunction with FIG. 10, the camera 3 and the light supplement module 4 for supplementing the camera 3 are disposed on the back of the terminal, the light supplement module 4 is disposed near the camera, and the shape of the light supplement module 4 may be a strip, or may be a circular or an irregular pattern, which is not limited in the present aspect. The structure of the light supplement module 4 is the same as that of the foregoing aspect. The color temperature sensor 5 for detecting the value of ambient color temperature is further disposed on the back surface of the terminal, and the functional relationship between the color temperature sensor 5, the light supplement module 4 and the camera is the same as that disclosed in the foregoing aspect.

Figure 11:
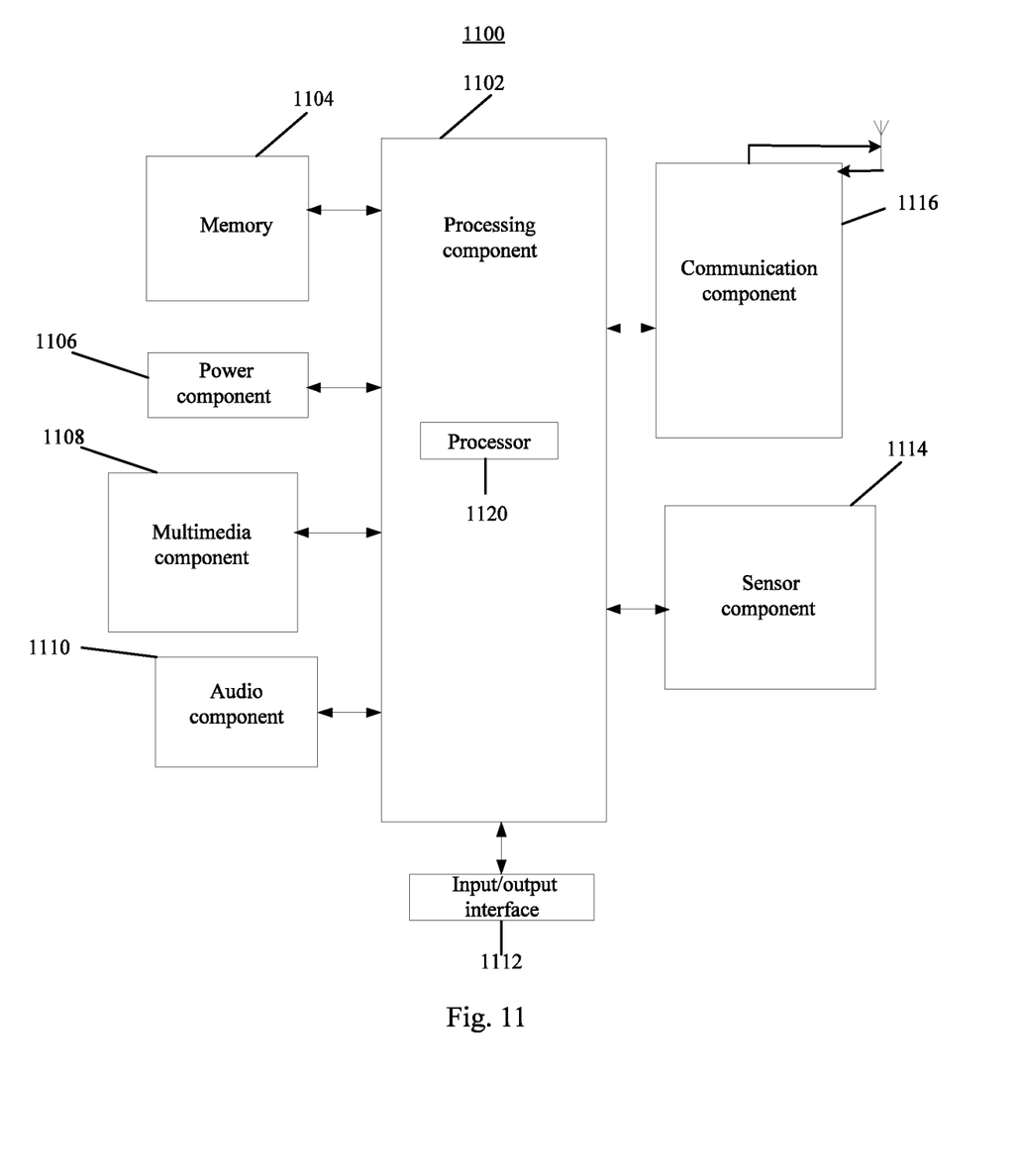
FIG. 11 is a structural diagram illustrating a terminal according to an exemplary aspect of the present disclosure.

FIG. 11 is a block diagram illustrating a terminal 1100 according to an exemplary aspect of the present disclosure. For example, the terminal 1100 may be a mobile phone, a computer, a digital broadcast terminal, a messaging device, a game console, a tablet, a medical device, exercise equipment, a personal digital assistant, and the like.

Referring to FIG. 11, the terminal 1100 may include one or more of the following components: a processing component 1102, a memory 1104, a power component 1106, a multimedia component 1108, an audio component 1110, an input/output (I/O) interface 1112, a sensor component 1114 and a communication component 1116.

The processing component 1102 typically controls overall operations of the terminal 1100, such as the operations associated with display, telephone calls, data communications, camera operation and recording operations. The processing component 1102 may include one or more processors 1120 to execute instructions to perform all or part of the steps of the methods described above. Moreover, the processing component 1102 may include one or more modules which facilitate the interaction between the processing component 1102 and other components. For instance, the processing component 1102 may include a multimedia module to facilitate the interaction between the multimedia component 1108 and the processing component 1102.

The memory 1104 is configured to store various types of data to support the operation of the terminal 1100. Examples of such data include instructions for any applications or methods operated on the terminal 1100, contact data, phonebook data, messages, pictures, video, etc. The memory 1104 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 1106 provides power to various components of the terminal 1100. The power component 1106 may include a power management system, one or more power sources, and any other components associated with the generation, management, and distribution of power in the terminal 1100.

The multimedia component 1108 includes a screen that provides providing an output interface between the terminal 1100 and the user. In some aspects, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some aspects, the multimedia component 1108 includes a front camera and/or a rear camera. The front camera and the rear camera may receive an external multimedia datum while the terminal 1100 is in an operation mode, such as a photographing mode or a video mode. Each of the front camera and the rear camera may be a fixed optical lens system or have focus and optical zoom capability. The screen includes a display area and a light supplement area, the display area is provided with a display module, an under-screen camera is provided below the display module, and the under-screen camera shoots through the display module; the light supplement area is disposed side by side or partially overlapped with the display area.

A light supplement lamp is disposed below the screen, and the light emitted from the light supplement lamp is transmitted through the light supplement area to supplement the under-screen camera.

The audio component 1110 is configured to output and/or input audio signals. For example, the audio component 1110 includes a microphone ("MIC") configured to receive an external audio signal when the terminal 1100 is in an operation mode, such as a call mode, a recording mode, and a voice recognition mode. The received audio signal may be further stored in the memory 1104 or transmitted via the communication component 1116. In some aspects, the audio component 1110 further includes a speaker to output audio signals.

The I/O interface 1112 provides an interface between the processing component 1102 and peripheral interface modules, such as a keyboard, a click wheel, buttons, and the like. The buttons may include, but are not limited to, a home button, a volume button, a starting button, and a locking button.

The sensor assembly 1114 includes one or more sensors to provide status assessments of various aspects of the terminal 1100. For instance, the sensor component 1114 may detect an open/closed status of the terminal 1100, relative positioning of components, e.g., the display and the keypad, of the terminal 1100, a change in position of the terminal 1100 or a component of the terminal 1100, a presence or absence of user contact with the terminal 1100, an orientation or an acceleration/deceleration of the terminal 1100, and a change in temperature of the terminal 1100. The sensor component 1114 may include a proximity sensor configured to detect the presence of nearby objects without any physical contact. The sensor component 1114 may also include a light sensor, such as a CMOS or CCD image sensor, for use in imaging applications. In some aspects, the sensor component 1114 may also include an accelerometer sensor, a gyroscope sensor, a magnetic sensor, a pressure sensor, a temperature sensor, or an ambient light brightness sensor. The ambient light brightness sensor is used for detecting the ambient light intensity, and when the ambient light brightness sensor detects that the intensity of the ambient light is lower than a preset value, the light supplement lamp is controlled to start to supplement the under-screen camera.

The communication component 1116 is configured to facilitate communication, wired or wirelessly, between the terminal 1100 and other devices. The terminal 1100 can access a wireless network based on a communication standard, such as WiFi, 2G, or 3G, or a combination thereof. In one exemplary aspect, the communication component 1116 receives a broadcast signal or broadcast associated information from an external broadcast management system via a broadcast channel. In one exemplary aspect, the communication component 1116 further includes a near field communication (NFC) module to facilitate short-range communications.

In an exemplary aspect, the terminal 1100 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described light supplement control methods.

In an exemplary aspect, there is also provided a non-transitory computer-readable storage medium including instructions, such as included in the memory 904, executable by the processor 920 in the terminal 900, for performing the above-described light supplement control methods. For example, the non-transitory computer-readable storage medium may be a ROM, a RAM, a CD-ROM, a magnetic tape, a floppy disc, an optical data storage device, and the like.

It should be understood that "a plurality of" as referred to herein means two or more. "and/or", describes an association relationship of associated objects, indicating that there may be three relationships, for example, A and/or B may indicate that A exists alone, A and B coexist, or B exists alone. The character "/" herein generally indicates that the contextual object is of an "or" relationship.

It is noted that the various modules, sub-modules, units, and components in the present disclosure can be implemented using any suitable technology. For example, a module may be implemented using circuitry, such as an integrated circuit (IC). As another example, a module may be implemented as a processing circuit executing software instructions.

Other aspects of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as illustrative only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A light supplement device, comprising:
   a circuit substrate;
   n Light Emitting Diodes (LED) disposed in an array on the circuit substrate, n being an integer greater than 1, and there being at least two LEDs having different colors; and
   a light guiding layer disposed on an upper layer of the n LEDs,
   wherein the LEDs are color LEDs, or the n LEDs constitute a color LED group,
   wherein the circuit substrate is electrically connected to a color temperature control chip, the color temperature control chip is electrically connected to a processor, and the processor is electrically connected to a color temperature sensor,
   wherein the color temperature sensor is configured to directly collect data of ambient color temperature,
   wherein the processor is configured to obtain the data of the ambient color temperature, calculate a value of the ambient color temperature according to the data of the ambient color temperature, and send the value of the ambient color temperature to the color temperature control chip, and
   wherein the color temperature control chip is configured to adjust, according to the value of the ambient color temperature and a reference value of color temperature, an overall color temperature of the n LEDs using a negative feedback mechanism by:
   determining the reference value of color temperature according to a white balance requirement;
   determining, according to a difference between the value of the ambient color temperature and the reference value of color temperature, a target group PWM signal from at least two sets of control parameters according to the negative feedback mechanism, each set of the control parameters comprising n PWM signals used for controlling the overall color temperature of the n LEDs to be a target color temperature, the n PWM signals corresponding to the n LEDs; and
   using the n PWM signals in the target group PWM signal to control the n LEDs respectively, wherein the n PWM signals comprise a current signal and/or a voltage signal.

2. The light supplement device according to claim 1, wherein the color temperature control chip is configured to adjust single or overall brightness of the n LEDs.

3. The light supplement device according to claim 2, wherein each of the LEDs is disposed in parallel with each other, and the color temperature control chip is configured to control brightness of each LED and a color ratio of an overall LED module.

4. The light supplement device according to claim 1, wherein the n LEDs disposed in the array comprise: a red LED, a green LED and a blue LED.

5. The light supplement device according to claim 1, wherein a red sub-LED, a green sub-LED and a blue sub-LED are packaged in at least one of the n LEDs disposed in the array.

6. The light supplement device according to claim 1, further comprising:
   a light homogenizing layer,
   wherein the light homogenizing layer is disposed between the light guiding layer and the n LEDs, or the light homogenizing layer is disposed on an upper layer of the light guiding layer.

7. The light supplement device according to claim 6, wherein the light homogenizing layer comprises at least one of a diffusion layer or a light homogenizing lens.

8. The light supplement device according to claim 1, wherein an interval of an overall color temperature of the n LEDs comprises: 2000 Kelvin to 7500 Kelvin.

9. A light supplement control method for a light supplement device, wherein the light supplement device comprises: a circuit substrate; n Light Emitting Diodes (LED) disposed in an array on the circuit substrate, n being an integer greater than 1, and there being at least two LEDs having different colors; a light guiding layer disposed on an upper layer of the n LEDs, wherein the LEDs are color LEDs, or the n LEDs constitute a color LED group, wherein the circuit substrate is electrically connected to a color temperature control chip, the color temperature control chip is electrically connected to a processor, and the processor is electrically connected to a color temperature sensor, the method comprising:
   directly collecting, via the color temperature sensor, data of ambient color temperature;
   obtaining, via the processor, the data of the ambient color temperature;
   calculating, via the processor, a value of the ambient color temperature according to the data of the ambient color temperature;

sending, via the processor, the value of the ambient color temperature to the color temperature control chip; and
adjusting, via the color temperature control chip, an overall color temperature of the n LEDs according to the value of the ambient color temperature, wherein adjusting the overall color temperature of the n LEDs comprises:
  adjusting, according to the value of the ambient color temperature and a reference value of color temperature, the overall color temperature of the n LEDs using a negative feedback mechanism by operations of:
  determining the reference value of color temperature according to a white balance requirement;
  determining, according to a difference between the value of the ambient color temperature and the reference value of color temperature, a target group PWM signal from at least two sets of control parameters according to the negative feedback mechanism, each set of the control parameters comprising n PWM signals used for controlling the overall color temperature of the n LEDs to be a target color temperature, the n PWM signals corresponding to the n LEDs; and
  using the n PWM signals in the target group PWM signal to control the n LEDs respectively, wherein the n PWM signals comprise a current signal and/or a voltage signal.

10. The method according to claim 9, further comprising:
performing color temperature analysis on a shot preview image to obtain the value of the ambient color temperature for adjusting the overall color temperature of the n LEDs according to the value of the ambient color temperature and an expected shooting effect.

* * * * *